(12) United States Patent
Shue et al.

(10) Patent No.: US 6,864,143 B1
(45) Date of Patent: Mar. 8, 2005

(54) ELIMINATE BRIDGING BETWEEN GATE AND SOURCE/DRAIN IN COBALT SALICIDATION

(75) Inventors: Shau-Lin Shue, Hsinchu (TW); Mei-Yun Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 09/489,970

(22) Filed: Jan. 24, 2000

(51) Int. Cl.$^7$ .............................................. H01L 21/336
(52) U.S. Cl. ...................... 438/299; 438/197; 438/221; 438/229; 257/336
(58) Field of Search ................................ 438/299, 229, 438/221, 197; 257/336

(56) References Cited

U.S. PATENT DOCUMENTS

| | | | | |
|---|---|---|---|---|
| 4,975,385 A | * | 12/1990 | Beinglass et al. | 437/44 |
| 5,554,566 A | * | 9/1996 | Lur et al. | 437/193 |
| 5,668,024 A | * | 9/1997 | Tsai et al. | 438/199 |
| 5,679,589 A | * | 10/1997 | Lee et al. | 437/40 |
| 5,824,588 A | * | 10/1998 | Liu | 438/302 |
| 5,851,890 A | * | 12/1998 | Tsai et al. | 438/303 |
| 6,258,729 B1 | * | 7/2001 | DeBoer et al. | 438/745 |

OTHER PUBLICATIONS

K. Inoue et al. "A new cobalt salicide technology for CMOS devices" IEEE transactions of electron devices vol. 45 No. 11, Nov. 1998, p. 2312–2318.*

* cited by examiner

*Primary Examiner*—Matthew Smith
*Assistant Examiner*—Granvill D. Lee
(74) *Attorney, Agent, or Firm*—Haynes and Boone, LLP (57) ABSTRACT

A new method is provided for the formation of salicided layers for a gate electrode structure. A gate electrode structure is formed, a first layer of gate spacers containing oxide is formed on the sidewalls of the gate structure. A second layer of gate spacers is deposited over the first layer of gate spacer, this second layer of gate spacer contains $SiN_x$. A layer of cobalt is deposited over the gate electrode thereby including the gate spacers. The layer of cobalt is salicided forming reacted and unreacted layers of cobalt whereby the reacted layers of cobalt form $CoSi_x$ on the surface of the gate electrode and the source/drain regions. The unreacted cobalt and the second gate spacer layer of $SiN_x$ are simultaneously removed from the sidewalls of the gate electrode leaving reacted layers of $CoSi_x$ in place over the surface of the gate structure and the surface of the source/drain regions. The process of removal of the unreacted cobalt combined with the removal of the layer of $SiN_x$ from the sidewalls of the gate electrode removes any possibility of electrical shorts between the points of contact of the gate electrode structure.

9 Claims, 4 Drawing Sheets

ELIMINATE BRIDGING BETWEEN GATE AND SOURCE/DRAIN IN COBALT SALICIDATION

BACKGROUND OF THE INVENTION (1) Field of the Invention

The invention relates to the fabrication of integrated circuit devices, and more particularly, to a method of forming salicided gate electrodes whereby no danger exists of having an electrical short between the gate contact and the contacts for the source and drain regions.

(2) Description of the Prior Art

With the continued demand for improved device performance comes a continued emphasis on decreasing device dimensions. Decreasing semiconductor dimensions provides the dual advantages of being able to dramatically increase device density and of significantly improving device performance. Device performance is improved with decreasing device dimensions because decreased device dimensions results in shorter paths that need to be traveled by charge carriers such as electrons. This is for instance the case in the creation of Metal-Oxide-Semiconductor Field-Effect Transistors (MOSFET) gate electrodes that have as electrical points of contact the gate surface and the source and drain regions. The distance between the source and drain regions forms the channel length of the gate electrode, by decreasing device dimensions the channel length is accordingly decreased resulting in a shorter path between the source and the drain regions. The result is that the switching speed of the device is increased. It is self evident that reducing device dimensions results in increased packaging density of devices on a semiconductor chip. This increased packaging density brings with it sharp reductions in the length of the interconnect paths between devices, which reduces the relative negative impact (such as resistive voltage drop, cross talk or RC delay) that these interconnect paths have on overall device performance.

Reducing device dimensions requires that the Critical Dimensions (CD) of the device are reduced. The ability to continue the reduction of device CD's depends to a considerable degree on the resolution capability of the technologies, such as photolithography, that are used in masking and etching device features. In order to create for instance the gate structure of a gate electrode, a layer of gate material such as polysilicon is etched after a layer of photoresist has been deposited over the surface of the layer of poly and has been exposed to a light source and etched. The photoresist that is used for this purpose is typically a positive photoresist, this layer of photoresist is exposed to a light source using a mask that contains opaque features. Where the light strikes the opaque features, the mask blocks the light so that the incident light will not reach the layer of photoresist. Where the mask is not opaque, the incident light will pass through the mask and strike the layer of photoresist. The chemical composition of the layer of photoresist is sensitive to certain wavelengths of light. With a positive layer of photoresist, the chemical composition of the photoresist that has been subjected to the incident light is changed such that the photoresist becomes soluble and can therefore be removed by a developer. The region of the layer of photoresist under which the poly gate structure of the gate electrode needs to be formed was not exposed by the incident light, the surrounding region of the layer of photoresist was exposed and can therefore be removed. The layer of poly that remains covered with photoresist is the region of the poly that forms the gate structure, since this region is now protected by the overlying layer of photoresist, the surrounding regions of the layer of poly can be etched away leaving only enough poly in place to form the structure of the gate electrode. The body or structure of the gate electrode can contain polysilicon but can also contain refractory metals, silicides and other conductive materials while doped polysilicon can also be used.

The process of photolithography that is used to expose the layer of photoresist typically uses mercury vapor lamps as the source of illumination with a wavelength of between about 390 and 450 nm. These sources of light exposure are frequently used in conjunction with I-line steppers, image reduction systems and other optical devices that are aimed at further improving exposure quality by improving exposure resolution and depth of focus. In applying masks for the creation of device features, the resolution of these device features is limited by the CD's of the mask that is applied in this process. Development is under way to create more advanced methods of exposure that apply such technologies as electron beam lithography, x-ray lithography and ion beam lithography. E-beam lithography uses a narrow stream of electrons that scribes a pattern in a layer of E-beam sensitive material, this method has allowed for feature size down to 0.1 um. Ion beam lithography does not have the inherent disadvantage of E-beam lithography of difficulty in concentrating a narrow stream of electrons. Ions are heavier than electrons and therefore are easier to project in a concentrated stream. X-ray lithography holds promise but suffers from the inherent limitation that X-rays, due to their smaller wavelength, are difficult to control. Future developments in all of these areas continue and are consistently aimed at providing the ability to reduce semiconductor device CD's into the sub-micron range, that is in the range of 0.20 um or less.

As previously stated, higher device performance and improved functional capacity in integrated circuits require reduction of device CD's and increased packaging density of the devices. Such requirements however cause problems of increased parasitic capacitance, device contact resistance (gate, source and drain contacts in MOSFET devices), and tight tolerance of pattern definition. Silicides are often used to reduce contact resistance. For very small sub-micron or sub-half-micron or even sub-quarter-micron modern silicon devices, conventional photolithographic technique for patterning contacts will not meet the required tolerance of critical dimensions. Methods that are being explored to improve resolution and feature size of applicable projection methods have been briefly highlighted above. In addition, in forming contact points to the gate electrode of a MOSFET device, the method of self-aligned silicide (salicide) formation helps to solve the problem of critical dimension tolerance. Using this method, the contact points that are formed for the source and the drain of the gate electrode self-align with the polysilicon gate. Salicides are therefore almost universally applied in today's high-density MOSFET devices. There are, however, problems associated with methods of salicide formation. One main problem is that the salicidation process of converting a refractory metal to its silicide is achieved by the consumption of silicon underlying the metal resulting in the consumption of substrate silicon in the regions of the source and drain. The source/drain junctions of sub-half-micron MOSFET devices are very shallow, the consumption of silicon in the source/drain regions can therefore result in source/drain regions that are extremely thin. A further and very severe problem is that the salicidation reaction can consume substrate silicon unevenly, leading to ragged source/drain junctions and, even worse, the creation of spikes that can penetrate through the junctions near the edges of the source/drain areas. Another problem that is directly related to the reduction in device CD's is that electrical shorts can occur between the contact points that are formed over the gate structure and the source/drain regions. The process of salicidation is followed by the removal of the unreacted metal from the gate spacers that have been formed over sidewalls of the gate electrode structure. If this removal is incomplete or not properly aligned, shorts are likely to occur between the layers of silicide that have been formed over the gate structure and the source/drain regions. It is therefore, with ever smaller device dimensions, becoming increasingly more difficult to create gate and source/drain points of electrical contact while maintaining the required low sheet resistance and low junction leakage current for the contact points. As salicides, both $TiSi_2$ and $CoSi_2$ can be used for the layer of metal from which the salicided contact points are formed. Both of these materials have low sheet resistivity. Of these two materials, $CoSi_2$ is the most promising for the formation of silicided layers of contact, especially for the extremely small device CD's that will be required in future devices. The problem of gate and source/drain bridging that has been highlighted above must however be addressed when using $CoSi_2$ as a metal for the salicidation process. The invention addresses this concern.

Figure 1:
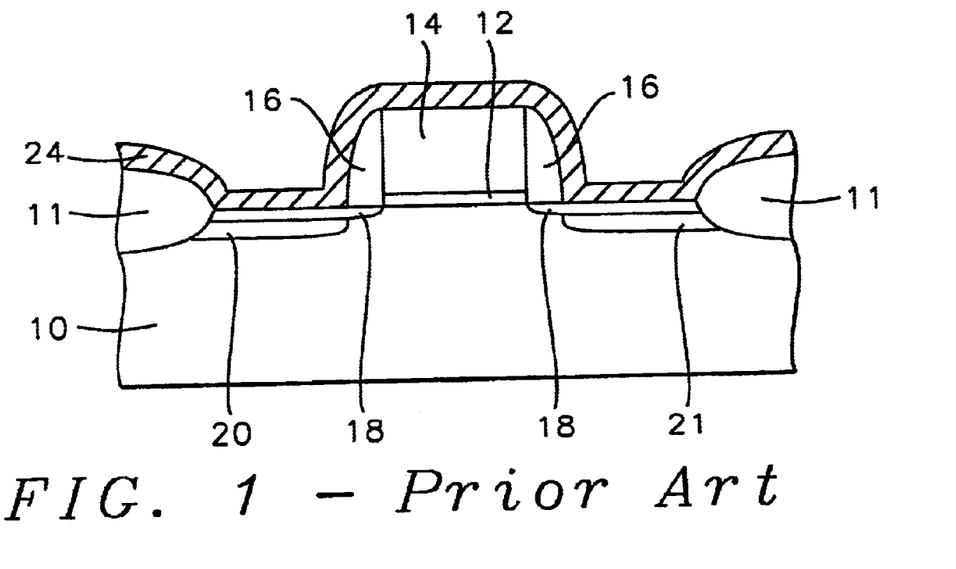
FIG. 1 shows a cross section of the Prior Art formation of a gate electrode structure up to the point of salicidation.

The formation of an n-type channel MOS device that has salicided source/drain contacts in addition to a salicided gate electrode will be detailed below. FIG. 1 shows a cross section of a p-type semiconductor surface 10, field isolation regions 11 of thick oxide have been provided in the surface of the substrate to define the active region of the substrate. A thin layer 12 of gate oxide has been formed using methods of thermal oxidation, a layer 14 of polysilicon is deposited over the surface of the gate oxide layer 12, this deposited layer 14 of poly is provided with a n-type conductivity and patterned to form the body of the gate electrode. The etch that is required to form the body of the gate electrode removes the deposited layer of poly and the deposited layer of gate oxide in accordance with the pattern of the gate electrode. An n-type ion implant 18 is performed into the surface of the substrate, this implant is self-aligned with the body 14 of the gate electrode and forms the LDD regions of the gate electrode. The gate spacers 16 are next formed by a blanket CVD deposition of a layer of silicon oxide over the surface of the gate electrode and its surrounding area, the layer 16 of silicon oxide is anisotropically etched back thereby forming the gate spacers 16 on the sidewalls of the gate electrode. A second, relatively deep and heavily doped n-type implant 20/21 is performed into the surface of the substrate 10 to form the source and drain regions 20/21 of the gate electrode 14. The region 18 of the LDD is now concentrated under the spacers 16 of the gate electrode. The next step in the process is the step of forming contacts with the gate electrode source (20) and drain (21) regions and the surface of the gate electrode 14. A layer 24 of refractory metal is blanket deposited over the entire structure. The structure that is shown in FIG. 1 is subjected to a heat treatment that causes layer 24 to react with the underlying layer 14 of poly and the underlying surface of the source and drain regions 20 and 21 whereby this layer of refractory metal 24 is fully converted to a silicide. The unreacted refractory metal has not formed silicide and is therefore removed by applying a selective etch that essentially removes the metal from the surface of the gate electrode spacers 16 leaving the silicided metal in place over the surface of the source 20 and drain 21 regions in addition to leaving the silicided metal in place over the surface of the gate electrode 14. A cross section of the gate structure after the unreacted refractory metal has been removed from the structure is shown in FIG. 2 where the layers 24 form the points of electrical contact to the gate electrode and the source and drain regions of this gate electrode.

Figure 2:
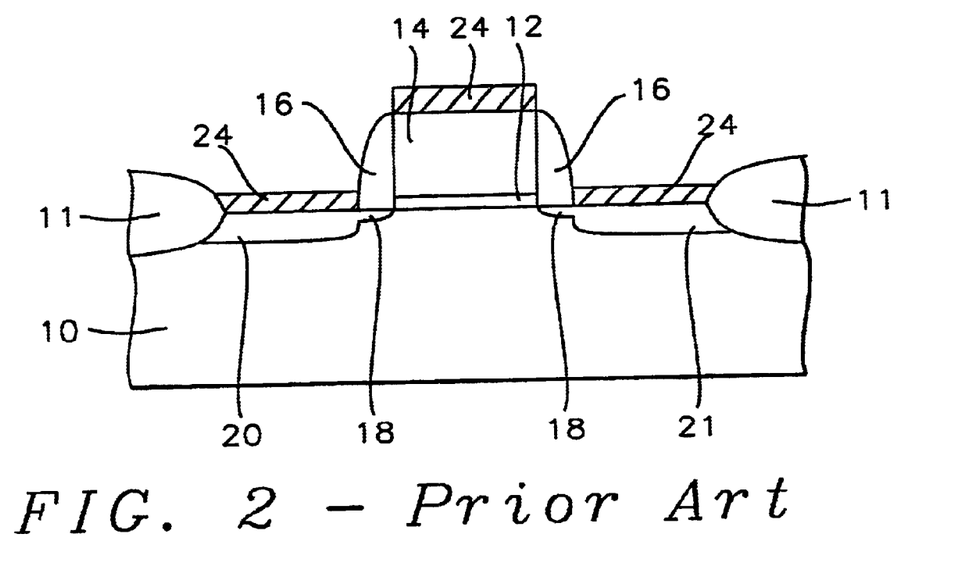
FIG. 2 shows a cross section of the Prior Art formation of a gate electrode structure after salicidation of the contact points for the gate electrode has been completed.
Figure 3:
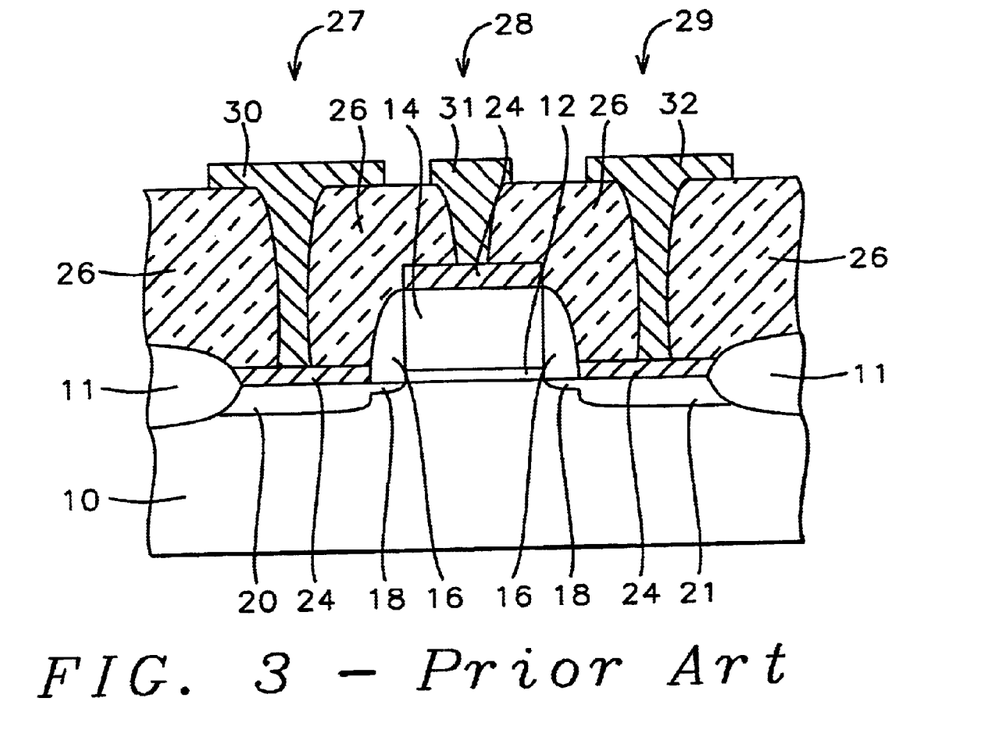
FIG. 3 shows a cross section of the Prior Art formation of a gate electrode structure after a layer of dielectric has been deposited over the surface of the gate electrode, openings have been created in the layer of dielectric and a layer of metal has been deposited and patterned to establish electrical continuity between the gate electrode (surface and source/drain regions) and a network of interconnecting lines.

FIG. 3 shows how the gate electrode of the Prior Art can be completed by depositing a layer 26 of dielectric over the surface of the structure that is shown in cross section in FIG. 2, by etching openings 27, 28 and 29 through this layer 26 of dielectric whereby (FIG. 3) opening 27 overlays and aligns with the source region 20 of the gate electrode, opening 28 overlays and aligns with the top surface of the gate electrode 14 and opening 29 overlays and aligns with the drain region 21 of the gate electrode. A layer of metal is then blanket deposited over the surface of the layer 26 of dielectric thereby including the openings 27, 28 and 29. This latter layer of metal is patterned and etched thereby creating the electrical contact 30 with the source region 20 of the gate electrode, contact 31 with the top surface of the gate electrode and contact 32 with the drain region 21 of the gate electrode. These three electrical contact points are typically connected to a surrounding network of interconnect metal lines.

U.S. Pat. No. 5,824,588 (Liu) shows a double spacer (oxide/oxide) salicide process.

U.S. Pat. No. 5,851,890 (Tsai et al.) teaches a double spacer (oxide/SiN) salicide process. This appears to show the invention except for the removal of the SiN spacer. This is extremely close to the invention.

U.S. Pat. No. 5,679,589 (Lee et al.) shows a salicide process with double spacers (e.g., oxide/SiN).

U.S. Pat. No. 5,668,024 (Tsai et al.) teaches a double spacer process (oxide/TiN) salicide process where the second spacer is removed as in the invention. This patent appears to differ from the invention only the composition of the 2'd spacer (TiN vs invention's SiN).

SUMMARY OF THE INVENTION

A principle objective of the invention is to provide a method for the formation of salicided gate electrode contact points for the era of sub-micron devices.

Another objective of the invention is to provide a method for the formation of salicided gate electrode contact points for the era of sub-micron devices whereby problems of electrical shorts between the contact points are avoided.

In accordance with the objectives of the invention a new method is provided for the formation of salicided layers for a gate electrode structure. A gate electrode structure is formed, a first layer of gate spacers containing oxide are formed on the sidewalls of the gate structure. A second layer of gate spacers is deposited over the first layer of gate spacer, this second layer of gate spacer contains $SiN_x$. A layer of cobalt is deposited over the gate electrode thereby including the gate spacers. The layer of cobalt is salicided forming reacted and unreacted layers of cobalt whereby the reacted layers of cobalt form $CoSi_x$ on the surface of the gate electrode and the source/drain regions. The unreacted cobalt is removed from the surface of the substrate, the second gate spacer layer of $SiN_x$ is removed from the sidewalls of the gate electrode leaving reacted layers of $CoSi_x$ in place over the surface of the gate structure and the surface of the source/drain regions. The process of removal of the unreacted cobalt combined with the removal of the layer of $SiN_x$ from the sidewall of the gate electrode removes any possi-

DESCRIPTION OF THE PREFERRED EMBODIMENTS

The process of the invention can be applied to any process of semiconductor fabrication where salicided layers of $CoSi_x$ are created. Static Random Access Memory (SRAM) cells are now being fabricated using high speed, high-density CMOS devices.

Conventional SRAM devices are usually configured using either four n-channel and two p-channel MOSFET devices or using four n-channel and two resistor load devices. Due to the complexity of these devices, the devices require considerably surface area. To decrease the need for area on the surface of a substrate, the Self Aligned Contact (SAC) approach has been developed. This approach uses a SAC opening in a dielectric layer that exposes underlying source or drain regions. The ability to efficiently use the SAC structure depends on the ability to reduce the resistance at the interface between the overlying polycide structure and the top surface of the source and drain regions that are exposed in the SAC opening.

Figure 4:
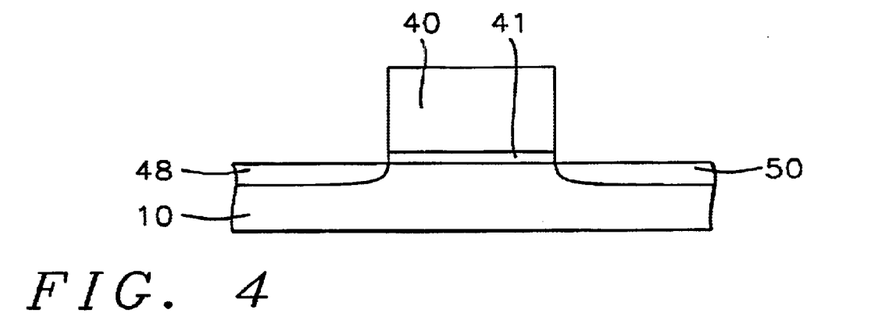
FIG. 4 shows a cross section of a partially completed gate electrode.

Referring now specifically to FIG. 4, there is shown a cross section of a partially completed gate electrode 40. A layer 41 of gate oxide has been deposited, a layer 40 of gate material (typically polysilicon) has been deposited. The layers 40 and 41 of gate material and gate oxide have been etched thereby forming the partially completed gate structure that is shown in cross section in FIG. 4. Impurity LDD implants 48/50 have been performed into the surface of substrate 10 that are self-aligned with the partially completed gate structure 40/41.

Layer 41 of gate oxide can be formed by thermal oxidation of the underlying silicon (in an oxidation steam ambient at a temperature of 700 to 1000 degrees C. to a thickness of 60 to 160 Angstrom) and can also be formed in conjunction with a deposited oxide layer, nitride layer or any other material suitable for use as a gate dielectric such as tetra-ethyl-ortho-silicate (TEOS), silicon dioxide or composite oxide or nitride oxide or a similar gate dielectric.

Layer 40 of polysilicon can be grown at a temperature between 600 and 640 degrees C. using LPCVD to a thickness of between about 2000 and 4000 Angstrom. Layer 40 may contain polysilicon but can also be created using other typical gate structure materials such as refractory metals, silicides and other conductive materials while doped polysilicon can also be used. The polysilicon gate structure 16 is patterned and etched using conventional methods of photolithography and etch whereby the etch can use CMP or using reactive ion, plasma or sputter etch techniques.

The LDD implant 48 and 50 forms the lightly doped regions for the source and drain regions of the MOS device. The LDD implant is performed using processing conditions that are determined by the type of device that is being created. For instance, if the device is a NMOS device, the implant uses arsenic or phosphorous with an energy within the range of between 5 to 60 keV and a dose within the range of between 1E15 to 5E15 atoms/cm$^2$. If the device is a PMOS device, the LDD implant uses BF$_2$ with an energy within the range of between 1 to 30 keV and a dose within the range of between 1E13 to 5E14 atoms/cm$^2$.

Figure 5:
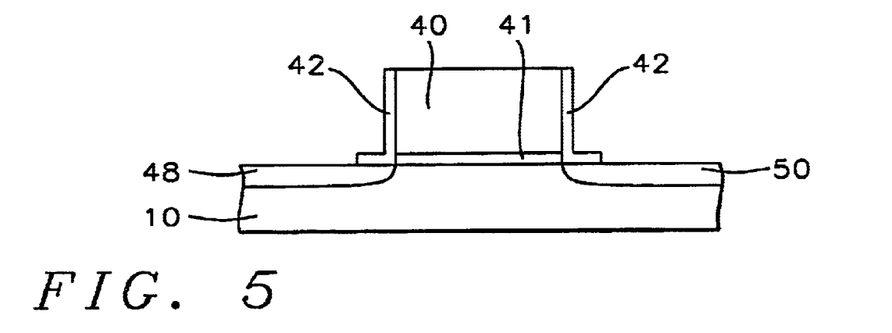
FIG. 5 shows a cross section of the partially completed gate electrode of the invention whereby gate spacers of oxide have been formed.

FIG. 5 shows a cross section of a gate electrode 40 whereby gate spacers of oxide (42) have been created. The layer 42 forms the first layer of a double layer gate spacer that is formed under the process of the invention. The deposition of the second layer of the gate spacer is further detailed under FIG. 6.

Typical spacers for gate electrodes can be made using a variety of materials such as silicon oxide, BSG, PSG, other materials preferably of a dielectric nature, CVD oxide formed from a TEOS source. The preferred material of the gate spacer 42 of the invention is silicon thermal oxide or CVD oxide.

The gate spacers 42 of silicon oxide can be formed by a thermal oxidation method in an oxidation environment, generally in steam at a high temperature such as 900 degrees C. for a time period of about 10 to 20 minutes to a thickness between about 200 and 500 Angstrom. The gate spacers 42 of CVD oxide can also be formed by thermally growing of a thin layer of oxide on the sides of said partially completed gate electrode using a short dry-oxidation process whereupon a conformal CVD oxide film is deposited by decomposing TEOS at between 700 and 750 degrees C. followed by an anisotropic dry etch thereby leaving the gate spacers 42 on the sidewalls of the gate electrode 40 to a thickness between about 200 and 500 Angstrom.

Figure 6:
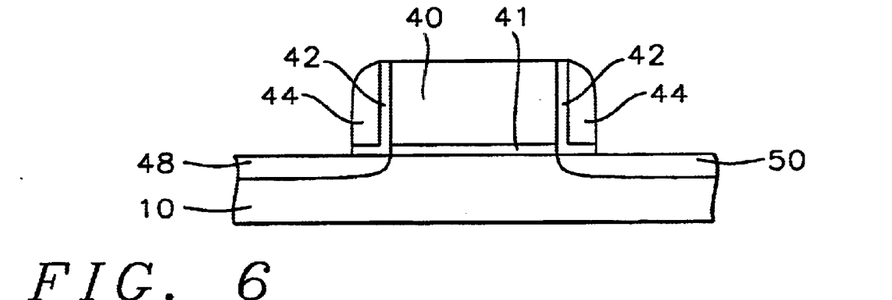
FIG. 6 shows a cross section after a layer of $SiN_x$ has been created over the surface of the gate spacers.

FIG. 6 shows a cross section of the gate electrode after the second layer 44 of silicon nitride ($SiN_x$) has been created to form the second layer the gate spacers.

The silicon nitride ($SiN_x$) can be deposited using LPCVD or PECVD procedures at a pressure between about 200 mTorr and 400 mTorr, at a temperature between about 600 and 800 degrees C., to a thickness of about 1500 to 3000 Angstrom using $NH_3$ and $SiH_4$ or $SiCl_2H_2$. The silicon nitride layer can also be deposited using LPCVD or PECVD procedures using a reactant gas mixture such as dichlorosilane ($SiCl_2H_2$) as a silicon source material and amonia ($NH_3$) as a nitrogen source, at a temperature between about 600 and 800 degrees C., at a pressure between about 300 mTorr and 400 mTorr, to a thickness of about 1500 to 3000 Angstrom.

The layer of silicon nitride is etched to form the gate spacers 44 via anisotropic RIE of the silicon nitride layer, using CHF3 or $SF_6$—$O_2$ as an etchant. Other methods for etching of the silicon nitride layer include using a SiON or SiN removal process with etchant gasses $CH_3F/Ar/O_2$ at a temperature between about 10 and 20 degrees C., a pressure of between about 50 and 60 mTorr with an etch time of between about 40 and 60 seconds. Also, a wet etch can be used applying a buffered oxide etchant (BOE). The BOE may comprise a mixed solution of fluoroammonium and fluorohydrogen (7:1) and phosphoric acid solution. The preferred method of etching the silicon nitride is an isotropic wet etch process using hot phosphoric acid.

Figure 7:
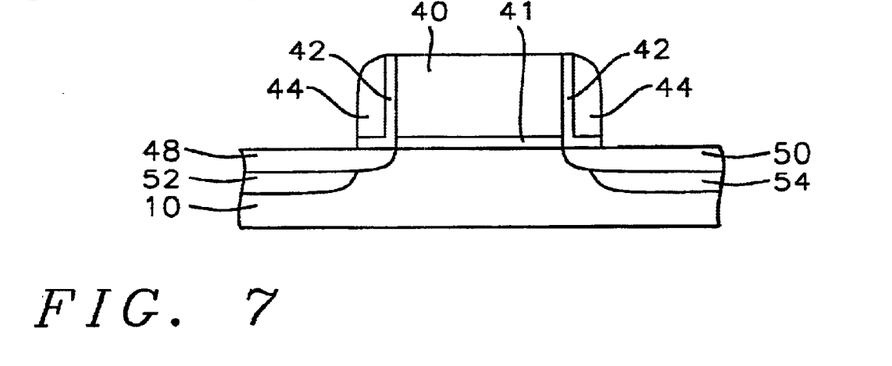
FIG. 7 shows a cross section after the source/drain implant has been performed.

FIG. 7 shows a cross section of the gate electrode after the source (52) and drain (54) implants into the surface of substrate 10 have been completed. Source (52) and drain (54) implants are, like the LDD implants, made under different processing conditions that are dependent on the requirements for the device that is being created. For instance a first conductivity imparting dopant using phosphorous can be implanted to create a lightly doped source and drain regions, ion implanted at an energy between about 5 to 60 KeV, at a dose between about 1E12 to 1E14 atoms/$cm^2$. A second conductivity imparting dopant can be used to create medium doped source and drain regions, such as arsenic or phosphorous, ion implanted at an energy between about 5 to 60 KeV, at a dose between about 1E13 to 5E14 atoms/$cm^2$. A third conductivity imparting dopant can be used to create heavily doped source and drain regions, such as arsenic, ion implanted at an energy between about 5 to 60 KeV, at a dose between about 1E15 to 5E15 atoms/$cm^2$.

Figure 8:
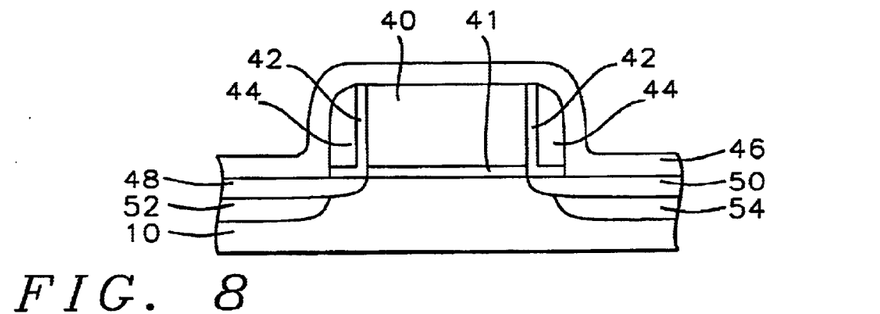
FIG. 8 shows a cross section after a layer of cobalt has been deposited over the surface of the structure.

FIG. 8 shows a cross section of the gate electrode after the layer 46 of cobalt has been deposited over the surface of the structure 40. The layer 46 of cobalt can be deposited to a thickness between about 30 to 300 $A^0$ at a temperature of 25 to 500 degrees C. using either rf. sputtering or CVD techniques.

Cobalt layer 46 is deposited over the structure of FIG. 7 thereby including the exposed surfaces of the source/drain regions and the top surface of the gate region 40 and annealed, thereby causing the cobalt to react with the underlying gate structure and the silicon of the substrate source/drain regions to form $CoSi_x$ on these surfaces.

Figure 9:
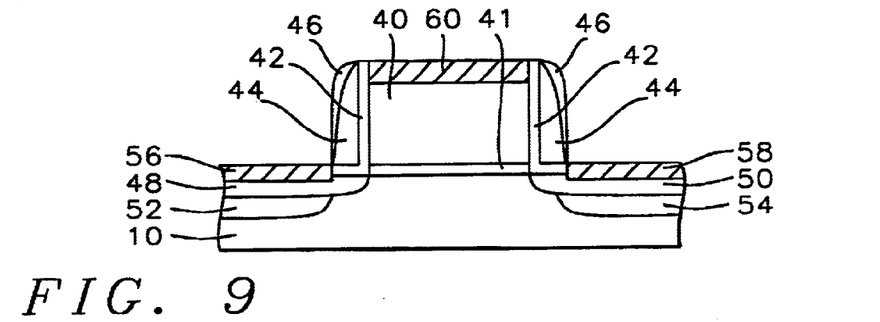
FIG. 9 shows a cross section of the gate electrode of the invention after the layer of cobalt has been salicided thereby forming $CoSi_x$ silicides over the surface of the gate structure and the surface of the source/drain regions.

FIG. 9 shows a cross section after the first anneal has been performed to the layer of cobalt thereby forming the layers 56/58 and 60 over the surfaces of the structure. This first anneal is typically a rapid thermal annealing in a temperature range of between about 600 and 800 degrees C. for a time between about 20 and 40 seconds in a nitrogen ambient. This first anneal forms reacted layers 56, 58 and 60 overlying respectively the source (52) and drain (54) regions and the surface of the gate structure (40) in addition to leaving unreacted layers 46 of cobalt overlying the gate spacers 42/44 of the gate electrode structure. The reacted cobalt is to stay in place, the unreacted cobalt is to be removed from the surface.

The second anneal to transform layers of reacted cobalt over the source/drain regions from the high resistivity phase to the low resistivity phase is a rapid thermal anneal in a temperature range of between about 800 and 900 degrees C. for a time between 20 and 40 seconds in an $N_2$ ambient.

It must be noted from the cross section that is shown in FIG. 9 that the reacted cobalt has combined with the underlying layers of silicon and gate electrode material such that the created layers of silicide penetrate the surface of the substrate (over the source/drain regions) and the surface of the gate electrode. The top layer of these reacted layers of cobalt will be removed during subsequent etching leaving the lower layer of reacted cobalt in place and overlying the surfaces of the source/drain regions and the gate electrode.

Figure 10:
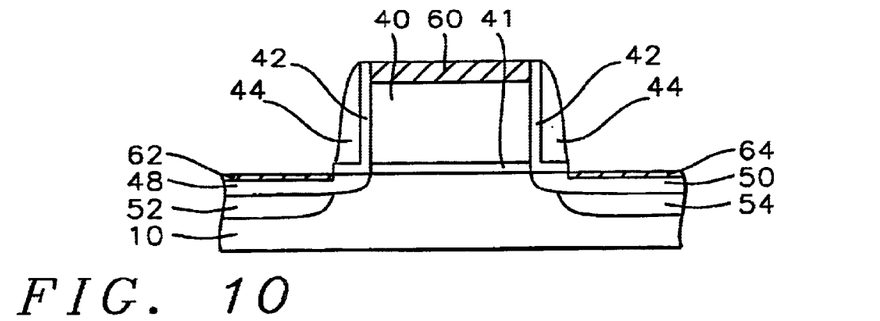
FIG. 10 shows a cross section of the gate electrode of the invention after the unreacted cobalt has been removed from the surface of the substrate.

FIG. 10 shows a cross section of the gate structure of the invention after the removal of the unreacted cobalt from the surface of the structure and specifically from the surface of the second gate spacer layers 44 of $SiN_x$. The unreacted cobalt is removed using a warm $H_3PO_4$ base etchant for a time of about 30 to 50 minutes leaving cobalt silicide in place overlaying the surface of the source/drain regions and the surface of the gate electrode. FIG. 10 further shows that the unreacted cobalt has been removed from the surface overlying the source (48) and drain (50) regions, leaving thin layers 62 and 64 of created cobalt in place respectively overlying the source (48) and the drain (50) regions.

Figure 11:
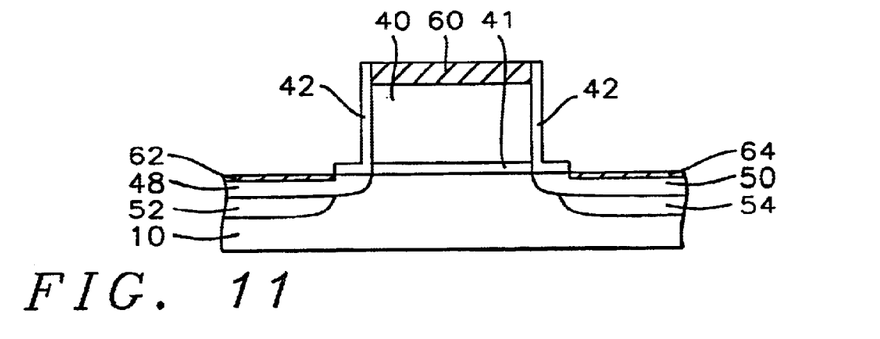
FIG. 11 shows a cross section of the gate electrode of the invention after the $SiN_x$ has been removed from the gate spacers.

FIG. 11 shows a cross section of the gate structure after the removal of layer 44 of $SiN_x$ from the sidewalls of the gate structure has been completed. This removal breaks any link that may have existed between the layers of the salicided conductive regions 56, 58 and 60 that form the points of electrical contact with the gate electrode.

After the gate electrode has been completed to the cross section that is shown in FIG. 11, the gate electrode can be further processed in accordance with a process that essentially resembles the process of the Prior Art that has been highlighted under FIG. 3 above. This further processing, which has as objective to further integrate the gate electrode that is shown in cross section in FIG. 11 into active semiconductor devices, is referred to as "back-end" processing. The back-end processing typically starts with the deposition of a layer of dielectric over the surface of the gate electrode that is shown in cross section in FIG. 11, creating openings in this layer of dielectric that align with the surface layer 60 of the gate electrode 40 and the surfaces 62 and 64 of the source (52) and drain regions (54), filling the openings created in the layer of dielectric with a conductive material, polishing the surface of the conductive material and patterning and etching the layer of conductive material, establishing patterns of interconnect lines that interconnect the gate electrode of FIG. 11 to surrounding electrical components.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a salicided gate electrode on the surface of a substrate, comprising the steps of:

provising a silicon semiconductor substrate; defining active regions in a surface of said substrate whereby said active regions are defined by regions of field insulation in said surface of said substrate;

growing a layer of gate oxide over said surface of said substrate;

depositing a layer of polysilicon over the surface of said layer of gate oxide;

patterning and etching said layer of polysilicon and said layer of gate oxide thereby forming a first gate electrode structure;

implanting LDD regions in said surface of said substrate whereby said LDD regions are self-aligned with said first gate electrode structure;

creating gate spacers whereby said gate spacers contain a first gate spacer layer overlying the sidewalls of said first gate electrode structure and a second gate spacer layer overlying said first gate spacer layer whereby said first gate spacer layer contains silicon oxide whereby furthermore said second gate spacer layer contains silicon nitride thereby creating an intermediately completed gate electrode structure;

performing source and drain implants into the surface of said substrate whereby said source and drain implants are self-aligned with said intermediately completed gate electrode structure;

depositing a layer of cobalt over the surface of said substrate thereby including the surface of said intermediately completed gate electrode structure;

saliciding said layer of cobalt thereby creating reacted and unreacted layers of cobalt on the surface of said substrate thereby including the surface of said intermediately completed gate electrode structure;

removing said unreacted cobalt from the surface of said substrate thereby including the surface of said intermediately completed gate electrode structure thereby creating salicided contact regions for said intermediately completed gate electrode structure, thereby including removing said second gate spacer layer from said intermediately completed gate electrode structure, using a warm $H_3PO_4$ based etchant for a time of between about 5 and 30 minutes, thereby forming a second gate electrode structure;

depositing a layer of Inter Level Dielectric (ILD) over the surface of said substrate thereby including the surface of said second gate electrode structure;

creating contact openings in said layer of ILD whereby said contact openings overlay and align with said salicided contact regions;

depositing a layer of metal over the surface of said layer of ILD thereby including said openings created in said layer of ILD;

planarizing said layer of deposited metal; and patterning and etching said deposited layer of metal.

2. A method for manufacturing salicided regions for electrical contact to a semiconductor device, comprising the sequential steps of:

providing a silicon semiconductor substrate whereby said substrate has been provided with a semiconductor device whereby said semiconductor device is a partially completed gate electrode structure;

creating double layered gate spacers on sidewalls of said partially completed gate electrode structure said double layered gate spacers containing an inner gate spacer comprising oxide layer that is immediately adjacent to and overlying the sidewalls of said partially completed gate electrode structure and an outer gate spacer layer comprising silicon nitride that overlays said inner layer thereby creating an intermediately completed gate electrode structure;

performing source and drain implants into the surface of said substrate whereby said source and drain implants are self-aligned with said intermediately completed gate electrode structure;

depositing a layer of cobalt over the surface of said substrate thereby including the surface of said intermediately completed gate electrode structure;

saliciding said layer of cobalt thereby creating reacted and unreacted layers of cobalt on the surface of said substrate thereby including the surface of said intermediately completed gate electrode structure;

removing said unreacted cobalt from the surface of said substrate thereby including the surface of said intermediately completed gate electrode structure; and, removing said outer gate spacer layer from said intermediately completed gate electrode structure, using a warm $H_3PO_4$ based etchant, thereby creating a gate electrode structure;

wherein said inner gate spacer layer contains silicon oxide formed by a thermal oxidation method in an oxidation environment of steam at a high temperature between about 700 and 1000 degrees C. for a time period of about 10 to 20 minutes thereby leaving said inner gate spacer layer on the sidewalls of said partially completed gate electrode to a thickness between about 200 and 500 Angstroms.

3. A method for manufacturing salicided regions for electrical contact to a semiconductor device, comprising the sequential steps of:

providing a silicon semiconductor substrate whereby said substrate has been provided with a semiconductor device whereby said semiconductor device is a partially completed gate electrode structure;

creating double layered gate spacers on sidewalls of said partially completed gate electrode structure said double layered gate spacers containing an inner gate spacer comprising oxide layer that is immediately adjacent to and overlying the sidewalls of said partially completed gate electrode structure and an outer gate spacer layer comprising silicon nitride that overlays said inner layer thereby creating an intermediately completed gate electrode structure;

performing source and drain implants into the surface of said substrate whereby said source and drain implants are self-aligned with said intermediately completed gate electrode structure;

depositing a layer of cobalt over the surface of said substrate thereby including the surface of said intermediately completed gate electrode structure;

saliciding said layer of cobalt thereby creating reacted and unreacted layers of cobalt on the surface of said substrate thereby including the surface of said intermediately completed gate electrode structure;

removing said unreacted cobalt from the surface of said substrate thereby including the surface of said intermediately completed gate electrode structure; and, removing said outer gate spacer layer from said intermediately completed gate electrode structure, using a warm $H_3PO_4$ based etchant, thereby creating a gate electrode structure;

wherein said inner gate spacer layer contains CVD oxide formed by thermally growing of a thin oxide on the sides of said partially completed gate electrode using a short dry-oxidation process whereupon a conformal CVD oxide film is deposited by decomposing TEOS at between 700 and 750 degrees C. followed by an anisotropic dry etch thereby leaving said inner gate spacer layer on the sidewalls of said partially completed gate electrode to a thickness between about 200 and 500 Angstroms.

4. A method for manufacturing salicided regions for electrical contact to a semiconductor device, comprising the sequential steps of:

providing a silicon semiconductor substrate whereby said substrate has been provided with a semiconductor device whereby said semiconductor device is a partially completed gate electrode structure;

creating double layered gate spacers on sidewalls of said partially completed gate electrode structure said double layered gate spacers containing an inner gate spacer comprising oxide layer that is immediately adjacent to and overlying the sidewalls of said partially completed gate electrode structure and an outer gate spacer layer comprising silicon nitride that overlays said inner layer thereby creating an intermediately completed gate electrode structure;

performing source and drain implants into the surface of said substrate whereby said source and drain implants are self-aligned with said intermediately completed gate electrode structure;

depositing a layer of cobalt over the surface of said substrate thereby including the surface of said intermediately completed gate electrode structure;

saliciding said layer of cobalt thereby creating reacted and unreacted layers of cobalt on the surface of said substrate thereby including the surface of said intermediately completed gate electrode structure;

removing said unreacted cobalt from the surface of said substrate thereby including the surface of said intermediately completed gate electrode structure; and, removing said outer gate spacer layer from said intermediately completed gate electrode structure, using a warm $H_3PO_4$ based etchant, thereby creating a gate electrode structure;

wherein said outer gate spacer layer contains silicon nitride ($SiN_x$) deposited using LPCVD or PECVD procedures at a pressure between about 200 mTorr and 400 mTorr, at a temperature between about 600 and 800 degrees C., to a thickness of about 1500 to 3000 Angstroms using $NH_3$ and $SiH_4$ or $SiCl_2H_2$.

5. The method of claim 4 wherein said outer gate spacer layer is created by etching said outer gate spacer layer whereby said etching is performed via anisotropic RIE of said outer gate spacer layer using $CHF_3$ or $SF_6$—$O_2$ as an etchant.

6. A method for manufacturing salicided regions for electrical contact to a semiconductor device, comprising the sequential steps of:

providing a silicon semiconductor substrate whereby said substrate has been provided with a semiconductor device whereby said semiconductor device is a partially completed gate electrode structure;

creating double layered gate spacers on sidewalls of said partially completed gate electrode structure said double layered gate spacers containing an inner gate spacer comprising oxide layer that is immediately adjacent to and overlying the sidewalls of said partially completed gate electrode structure and an outer gate spacer layer comprising silicon nitride that overlays said inner layer thereby creating an intermediately completed gate electrode structure;

performing source and drain implants into the surface of said substrate whereby said source and drain implants are self-aligned with said intermediately completed gate electrode structure;

depositing a layer of cobalt over the surface of said substrate thereby including the surface of said intermediately completed gate electrode structure;

saliciding said layer of cobalt thereby creating reacted and unreacted layers of cobalt on the surface of said substrate thereby including the surface of said intermediately completed gate electrode structure;

removing said unreacted cobalt from the surface of said substrate thereby including the surface of said intermediately completed gate electrode structure; and, removing said outer gate spacer layer from said intermediately completed gate electrode structure, using a warm $H_3PO_4$ based etchant, thereby creating a gate electrode structure;

wherein said outer gate spacer layer contains silicon ($SiN_x$) is deposited using LPCVD or PECVD procedures using a reactant gas mixture such as a dichlorosilane ($SiCl_2H_2$) as a silicon source material and ammonia ($NH_3$) as a nitrogen source, at a temperature between about 600 and 800 degrees C., at a pressure between 300 mTorr and 400 mTorr, to a thickness of about 1500 and 3000 Angstroms.

7. The method of claim 6, wherein said outer gate spacer layer is created by etching said outer gate spacer layer whereby said etching is performed via anisotropic RIE of said outer gate spacer layer using $CHF_3$ or $SF_6$—$O_2$ as an etchant.

8. A method for manufacturing salicided regions for electrical contact to a semiconductor device, comprising the sequential steps of:

providing a silicon semiconductor substrate whereby said substrate has been provided with a semiconductor device whereby said semiconductor device is a partially completed gate electrode structure;

creating double layered gate spacers on sidewalls of said partially completed gate electrode structure said double layered gate spacers containing an inner gate spacer comprising oxide layer that is immediately adjacent to and overlying the sidewalls of said partially completed gate electrode structure and an outer gate spacer layer comprising silicon nitride that overlays said inner layer thereby creating an intermediately completed gate electrode structure;

performing source and drain implants into the surface of said substrate whereby said source and drain implants are self-aligned with said intermediately completed gate electrode structure;

depositing a layer of cobalt over the surface of said substrate thereby including the surface of said intermediately completed gate electrode structure;

saliciding said layer of cobalt thereby creating reacted and unreacted layers of cobalt on the surface of said substrate thereby including the surface of said intermediately completed gate electrode structure;

removing said unreacted cobalt from the surface of said substrate thereby including the surface of said intermediately completed gate electrode structure; and, removing said outer gate spacer layer from said intermediately completed gate electrode structure, using a warm $H_3PO_4$ based etchant, thereby creating a gate electrode structure;

wherein said saliciding said layer of cobalt is a first anneal followed by a second anneal whereby said first anneal is a rapid thermal anneal in a temperature range of between about 350 and 600 degrees C. for a time between about 20 and 40 seconds in a nitrogen ambient whereby said second anneal is a rapid thermal anneal in a temperature range of between about 800 and 900 degrees C. for a time between 20 and 40 seconds in an $N_2$ ambient.

9. A method for manufacturing salicided regions for electrical contact to a semiconductor device, comprising the sequential steps of:

providing a silicon semiconductor substrate whereby said substrate has been provided with a semiconductor device whereby said semiconductor device is a partially completed gate electrode structure;

creating double layered gate spacers on sidewalls of said partially completed gate electrode structure said double layered gate spacers containing an inner gate spacer comprising oxide layer that is immediately adjacent to and overlying the sidewalls of said partially completed gate electrode structure and an outer gate spacer layer comprising silicon nitride that overlays said inner layer thereby creating an intermediately completed gate electrode structure;

performing source and drain implants into the surface of said substrate whereby said source and drain implants are self-aligned with said intermediately completed gate electrode structure;

depositing a layer of cobalt over the surface of said substrate thereby including the surface of said intermediately completed gate electrode structure;

saliciding said layer of cobalt thereby creating reacted and unreacted layers of cobalt on the surface of said substrate thereby including the surface of said intermediately completed gate electrode structure;

removing said unreacted cobalt from the surface of said substrate thereby including the surface of said intermediately completed gate electrode structure; and, removing said outer gate spacer layer from said intermediately completed gate electrode structure, using a warm $H_3PO_4$ based etchant, thereby creating a gate electrode structure;

wherein said removing said unreacted cobalt from the surface of said substrate thereby including said outer gate spacer layer from said intermediately completed gate electrode structure is using a warm $H_3PO_4$ based etchant for a time of between about 5 and 30 minutes.

* * * * *